United States Patent [19]

Fukuda et al.

[11] 4,218,626

[45] Aug. 19, 1980

[54] ELECTROMAGNETIC RELAY

[75] Inventors: Hiroshi Fukuda, Tokyo; Minoru Shimoda, Hiratsuka, both of Japan

[73] Assignee: Matsu Kyu Kabushiki Kaisha, Higashi-Nihonbashi, Japan

[21] Appl. No.: 930,752

[22] Filed: Aug. 2, 1978

[30] Foreign Application Priority Data

Mar. 15, 1978 [JP] Japan .............................. 53-32994[U]

[51] Int. Cl.$^2$ ........................................... H01H 36/00
[52] U.S. Cl. ................................... 307/116; 307/309; 338/32 H
[58] Field of Search ............... 307/116, 117, 309, 278; 310/DIG. 3; 338/32 H, 32 R; 323/94 H; 335/2, 179

[56] References Cited

U.S. PATENT DOCUMENTS 3,652,878  3/1972  Schmidt .............................. 307/309

OTHER PUBLICATIONS

"Contactless Switching with the Magnetically Controlled Switches SAS201 and SAS211 in Integrated Semiconductor Technique,"-Gutter-Components Report, vol. 9, No. 2, pp. 63-65, May 1974.

*Primary Examiner*—Harry E. Moose, Jr.
*Attorney, Agent, or Firm*—Haseltine, Lake & Waters

[57] ABSTRACT

An electromagnetic relay is provided including a Hole integrated circuit disposed in a gap formed in a magnetic circuit including a yoke formed at its opposite end with turned portions, a core disposed between the turned portions, and an energizing coil surrounding the core. A permanent magnet is provided in the gap for providing a magnetic bias so as to increase the magnetic flux density of the magnetic field.

3 Claims, 6 Drawing Figures

ELECTROMAGNETIC RELAY

BACKGROUND OF THE INVENTION

Field of the Invention

The invention relates to an electromagnetic relay and, more particularly, to an electromagnetic relay including a magneto-electro converting device such as a Hall integrated circuit (Hall IC) or the like, and an energizing coil responsive to an electric signal for producing a magnetic field to drive the magneto-electro converting element.

Electromagnetic relays have been widely used in many applications which normally include one or more coils controlling one or more armatures each actuating electric contacts. However, such prior electromagnetic relays have had numerous disadvantages such as the use of contacts. First, bouncing and chattering occur in their switching operations. Second, there is a tendency of the contacts to be soiled with gas, dust, and soldering flux resulting in defective contact. Third, their service life is relatively limited due to the use of the contacts. In order to avoid or eliminate these disadvantages, contactless relays have been proposed, but they are incompetent in driving a large load.

Recently, input/output isolation has become an especially important factor in digital circuit designs. In view of this consideration, opto-couplers have been often used to couple digital circuits with superior electrical isolation which include a light source such as a light emission diode and a light detector such as a phototransistor housed in space relation in a single package. However, such opto-couplers have been found disadvantageous in that they are subjective to frequent failure or breakdown with an excessive voltage applied across the light emission diode or with an input signal reversely applied across the light emission diode and that they require such an adjustment that the phototransistor can receive a sufficient amount of light beam in order to maintain the S/N ratio.

In addition, for modern uses, size has become an increasingly important consideration. Small size units generally carry with them the additional advantages of lesser weight and smaller power consumption. The use of modern semiconductors can be a big advantage in reducing size, weight and power consumption. However, the advantages attendent upon the use of semiconductors are obtained only if they are operated within their electrical and thermal ratings.

SUMMARY OF THE INVENTION

It is, therefore, a general object of the present invention to provide a new and improved electromagnetic relay which avoids or eliminates many of the limitations and drawbacks inherent in previous designs.

Another object of the present invention is to provide an improved electromagnetic relay which is relatively small in size and long in service life.

Another object of the present invention is to provide an improved electromagnetic relay which provides superior isolation between input and output circuits as compared with opto-couplers.

Another object of the present invention is to provide an improved electromagnetic relay which provide regular output waveforms regardless of input waveforms.

Still another object of the present invention is to provide a contactless relay which is operable without bouncing and chattering and without failure or breakdown.

In accordance with the present invention, there is provided an electromagnetic relay comprising a magnetic circuit having a gap, the magnetic circuit including a yoke having at its opposite ends turned portions extending in parallel spaced relation, a core having its one end attached to one of the turned portions and the other end facing the other turned portion, an energizing coil surrounding the core, and the gap located between the other turned portion and the other end of the core. A magnetoelectro converting device is provided in the gap which is sensitive to the magnetic field produced in the magnetic circuit for providing an output signal. A permanent magnet is disposed in the gap for increasing the magnetic flux density of the magnetic field. This permits the use of a small sized energizing coil resulting in a small sized relay. There is preferably provided means for adjusting the distance of the gap so as to adjust the output voltage of the magneto-electro converting device.

Other objects and advantages of the present invention will become apparent to those skilled in the art from a consideration of the following detailed description of one exemplary embodiment of the present invention.

BRIEF DESCRIPTION OF THE DRAWINGS

The following description of the present invention is had in conjunction with the accompanying drawings, in which.

DETAILED DESCRIPTION OF THE INVENTION

Figure 1:
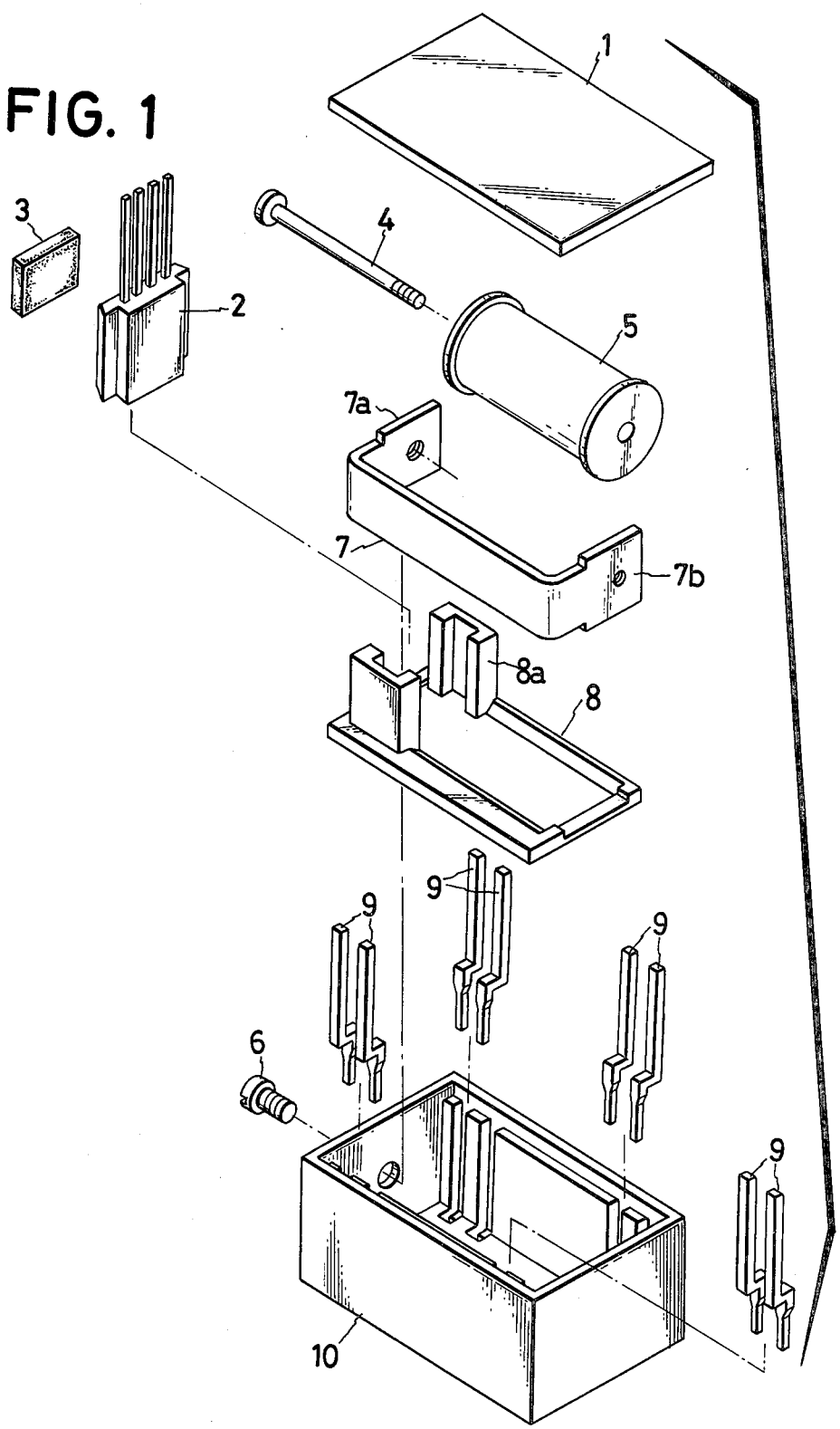
FIG. 1 is an exploded perspective view showing elements contained in the electromagnetic relay of the present invention.
Figure 2:
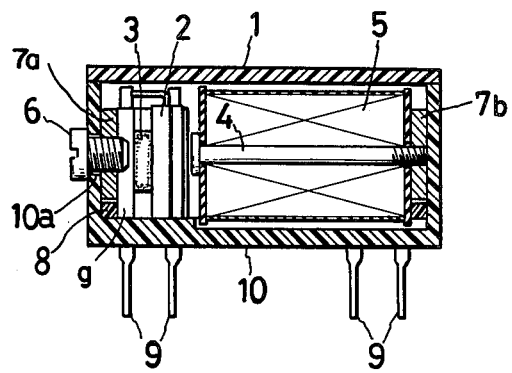
FIG. 2 is a schematic sectional view of the electromagnetic relay of the present invention with the elements of FIG. 1 assembled.

Referring now to the drawings, and initially to FIGS. 1 and 2 thereof, there is illustrated one embodiment of electromagnetic relay of the present invention. The electromagnetic relay comprises a casing 10 having a cover 1, and a yoke 7 having a magnetic flux focusing function and contained in the casing 10. The yoke 7 has at its opposite ends turned portions 7a and 7b extending in parallel spaced relation. The electromagnetic relay comprises an energizing coil 5 having a center bore in which is inserted an elongated core 4 formed of a suitable magnetic alloy of high permeability. The core 4 has its one end attached to the turned portion 7b of the yoke 7 and the other end facing the other turned portion 7a. Extending outwardly through the bottom wall of the casing 10 are input and output terminals of the energizing coil 5. Between the other end of the core 4 and the turned portion 7a of the yoke 7 there is provided a magneto-electro converting device 2 such as a Hall integrated circuit (Hall IC) or the like which is sensitive to a magnetic field produced by the coil 5 for providing an output signal. The device 2 is set in a holder 8a formed on a bracket 8. A permanent magnet 3 is attached to the device 2 for providing a magnetic bias so as to increase the magnetic flux density of the magnetic field produced by the energizing coil 5. This permits the use of an energizing coil small in size and low in heat dissipation, resulting in a smalled sized electromagnetic relay. An adjustment screw 6 is provided in mesh engagement with a threaded portion 10a formed in the casing 10 for adjusting the distance of the gap between the turned portion 7a of the yoke 7 and the permanent magnet 3 so as to adjust the output voltage obtained from the device 2.

Figure 3:
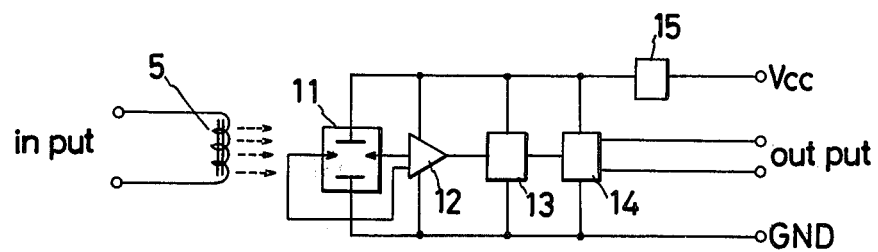
FIG. 3 is a circuit diagram of the Hall integrated circuit employed in the present invention.

FIG. 3 illustrates a circuit contained in the Hall integrated circuit which comprises a hall sensor 11, an amplifier circuit 12, a Schmitt circuit 13, an output circuit 14, and a regulated power supply 15.

In operation, when an input signal is applied through the terminals 9 across the energizing coil 5, the coil 5 is energized to produce a magnetic field in the direction normal to the surface of the device 2 by the function of the core 4 so as to drive the device 2 disposed in the gap labelled by symbol g of the magnetic circuit including the core 4, the yoke 7, and the permanent magnet 3. As a result, the hall sensor produces a voltage in accordance with the magnetic flux density of the magnetic field applied to the hall sensor 11. The produced voltage is amplified in the amplifier circuit 12 and then is fed through the Schmitt trigger circuit 13 and the output circuit 14 to its output terminals so as to provide an output in the form of an digital voltage signal.

Figure 4:
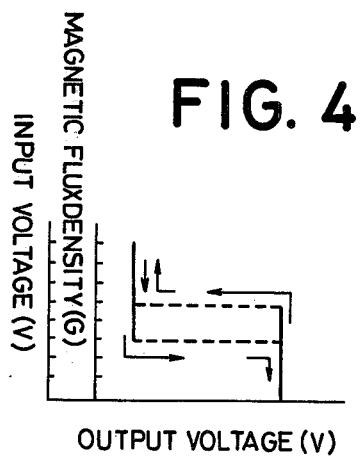
FIG. 4 is a curve of input voltage versus output voltage used to explain the operation of the electromagnetic relay of the present invention.
Figure 5:
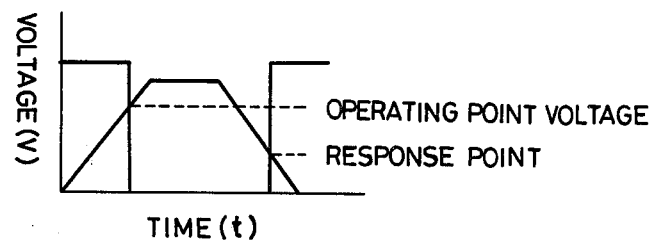
FIG. 5 is a curve of input voltage versus time used to explain the operation of the electromagnetic relay of the present invention.

It can be seen from a consideration of FIGS. 4 and 5 that the output voltage changes from its OFF state to its ON state with the input voltage increasing to the operating point voltage, the output voltage remains in the ON state even when the input voltage decreases to the operating point voltage, and the output voltage changes from the ON state to the OFF state with the input voltage decreasing to the threshold level. This clearly shows that the electromagnetic relay of the present invention perform a stable operation because of its hysteresis characteristics and that it provides a regular square wave regardless of the input voltage having a distorted waveform, swinging near the operating point, having an excessive level, and long in rising and breaking time.

Figure 6:
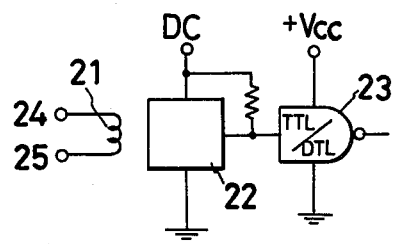
FIG. 6 is a circuit diagram showing a direct connection between the electromagnetic relay of the present invention and a transistor transistor logic circuit (TTL) or diode transistor logic (DTL).

FIG. 6 illustrates a direct connection of the electromagnetic relay of the present invention and a transistor transistor logic circuit (TTL) or diode transistor logic circuit (DTL), in which the reference numeral 21 designates an energizing coil, the numeral 22 a Hall relay, the numeral 23 a DTL or TTL, and the numerals 24 and 25 input terminals connected across the energizing coil. The electromagnetic relay of the present invention can also drive a reed relay, transistor, RTL, MOS, SCR, or the like.

Although the electromagnetic relay has been illustrated and described as providing digital form output signals, it is to be understood that it may be designed to provide output signals in a linear fashion.

While the present invention has been described with reference to a preferred embodiment, it will be understood by those skilled in the art that various changes may be made and equivalents may be substituted for elements thereof without departing from the spirit and scope of the present invention.

What is claimed is:

1. An electromagnetic relay comprising: a magnetic circuit having a gap, said magnetic circuit including a yoke having at its opposite ends turned portion extending in parallel spaced relation, a core having its one end attached to one of said turned portions and the other end facing the other turned portion, and an energizing coil surrounding said core, said energizing coil being energized when an input signal is impressed on the electromagnetic relay, said gap being located between the other turned portion of said yoke and the other end of said core; a magneto-electro converting device in said gap; a permanent magnet disposed in said gap for increasing the magnetic flux density of the magnetic field produced in said gap; and means for adjusting the distance of said gap, thereby making it possible to adjust the magnetic density within the magnetic circuit to obtain a desired output of the electromagnetic relay.

2. An electromagnetic relay as defined in claim 1 wherein said magnetic-electro converting device is a Hall integrated circuit.

3. An electromagnetic relay as defined in claim 1 wherein operating voltages obtained as output voltages at the time when an input exceeds predetermined threshold levels are independently adjustable, an operating time of the relay being adjustable, the duty ratio of output pulses of the relay being adjustable by said means for adjusting the distance of said gap.

* * * * *